(12) United States Patent
Ackermann et al.

(10) Patent No.: US 8,348,472 B2
(45) Date of Patent: Jan. 8, 2013

(54) LIGHTING DEVICE WITH REFLECTIVE ELECTROACTIVE POLYMER ACTUATOR

(75) Inventors: Bernd Ackermann, Aachen (DE); Reinhold Elferich, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 246 days.

(21) Appl. No.: 12/865,446

(22) PCT Filed: Feb. 2, 2009

(86) PCT No.: PCT/IB2009/050404
§ 371 (c)(1),
(2), (4) Date: Jul. 30, 2010

(87) PCT Pub. No.: WO2009/098629
PCT Pub. Date: Aug. 13, 2009

(65) Prior Publication Data
US 2010/0296294 A1    Nov. 25, 2010

(30) Foreign Application Priority Data
Feb. 5, 2008    (EP) ..................... 08101279

(51) Int. Cl.
*F21V 7/00*    (2006.01)
(52) U.S. Cl. .............. 362/296.01; 362/311.02; 362/97.3
(58) Field of Classification Search ............ 362/296.01, 362/311.03, 257, 362, 311.01, 311.02, 600, 362/623, 247, 92, 812, 551, 559
See application file for complete search history.

(56) References Cited

U.S. PATENT DOCUMENTS

| | | | |
|---|---|---|---|
| 4,821,053 A | 4/1989 | Dowe et al. | |
| 7,015,624 B1 | 3/2006 | Su et al. | |
| 7,178,941 B2 | 2/2007 | Roberge et al. | |
| 7,259,503 B2 | 8/2007 | Pei et al. | |
| 7,275,846 B2 | 10/2007 | Browne et al. | |
| 7,279,722 B2 | 10/2007 | Goon et al. | |
| 2006/0062000 A1 | 3/2006 | Peterson | |
| 2006/0250789 A1 | 11/2006 | Coushaine | |
| 2007/0200454 A1 | 8/2007 | Smith | |
| 2007/0263963 A1 | 11/2007 | Hughes et al. | |

FOREIGN PATENT DOCUMENTS

| | | |
|---|---|---|
| DE | 202007000549 U1 | 3/2007 |
| WO | 9845746 A1 | 10/1998 |
| WO | 2005085930 A1 | 9/2005 |
| WO | 2007072411 A1 | 6/2007 |

OTHER PUBLICATIONS

Kanno et al: "Development of Deformable Mirror Composed of Piezolelectric Thin Film for Adaptive Optics"; IEEE Journal of Selected Topics in Quantum Electronics, vol. 13, No. 2, Mar./Apr. 2007, pp. 155-161.

Huang et al: "Electroactive Polymer (EAP) Based Deformable Micromirrors and Light-Valve Technology for MOEMS Display and Imaging Systems"; Proceedings of the SPIE, vol. 5389, No. 1, Jan. 2004, pp. 274-285.

*Primary Examiner* — Joseph L Williams
(74) *Attorney, Agent, or Firm* — Mark L. Beloborodov

(57) ABSTRACT

Disclosed is a lighting device, including at least partially reflective electroactive polymer actuator and a lighting element illuminating the electroactive polymer actuator. A voltage control arrangement for driving the electroactive polymer actuator with a spatially varying voltage distribution is provided. This way, the curvature and alignment of the reflective surface of the electroactive polymer actuator can be adjusted as needed, thereby providing an optimized beam pattern for the relevant field of application.

10 Claims, 5 Drawing Sheets

LIGHTING DEVICE WITH REFLECTIVE ELECTROACTIVE POLYMER ACTUATOR

FIELD OF THE INVENTION

The invention relates to the field of lighting devices and lighting modules comprising a lighting element as a light source, like an LED (light emitting diode), and a primary optical element, like a mirror or a reflector.

BACKGROUND OF THE INVENTION

It is generally known to integrate optical elements, e.g. lenses and reflectors, thus combining the optical beam of LEDs and the LEDs into compact LED modules.

U.S. Pat. No. 7,275,846 discloses an adaptive head light assembly, comprising a parabolic reflector for housing a filament assembly, a lever arm having one end pivotably affixed to a bearing point of the parabolic reflector, and an actuator in operative communication with the other end of the lever arm to actuate motion of the lever arm. The actuator comprises a shape memory material adapted to change a shape orientation or modulus property upon receipt of an activation signal; and a spring is provided which is in operative communication with the other end of the lever arm and adapted to provide a restoring force. Such adaptive lighting assemblies are suited for use in moving bodies, e.g., vehicles, and automatically optimize the beam pattern to accommodate road, driving and environmental conditions by moving, modifying, and/or adding light to the beam pattern. Suitable shape memory materials include electroactive polymers (EAP).

However, the adaptive head light assembly described in U.S. Pat. No. 7,275,846, which uses EAPs as shape memory material, only allows a very restricted degree of beam forming and is complicated to control.

SUMMARY OF THE INVENTION

It is an object of the invention to provide a lighting device which allows easy and versatile control of the irradiated light beam.

This object is achieved by a lighting device comprising an at least partly reflective electroactive polymer actuator and a lighting element illuminating the electroactive polymer actuator, wherein a voltage control arrangement for driving the electroactive polymer actuator with a spatially varying voltage distribution is provided.

Thus, it is an important idea of the invention to provide a reflective electroactive polymer actuator the shape of which can be controlled continuously with the aid of a spatially varying voltage distribution. This way, the curvature and alignment of the reflective surface of the electroactive polymer actuator can be adapted to the requirements, thus always providing an optimized beam pattern for the relevant field of application.

Above, it has been stated that the electroactive polymer actuator is at least partly reflective. This means that at least part of the area of the electroactive polymer actuator is reflective. However, according to a preferred embodiment of the invention, the total surface of the electroactive polymer actuator is reflective. Further, the feature that at least part of the surface of the electroactive polymer actuator is reflective means that an essential part of the light incident on the surface is reflected; preferably more than half of the light, more preferably more than 90% of the light, is reflected.

In general, multiple, different kinds of lighting elements can be used as light sources. However, according to a preferred embodiment of the invention, the lighting element comprises an LED. Especially the use of modern side-emitting LEDs will lead to very compact and flat lighting modules.

Generally, multiple, different locations for the lighting element are possible. According to a preferred embodiment of the invention, however, the lighting element is at least partly located in a focal point of the electroactive polymer reflector. Preferably, the lighting element is fully located in the focal point of the electroactive polymer reflector. This will lead to the most efficient rate of yield for the emitted light.

According to a preferred embodiment of the invention, the electroactive polymer actuator is provided with a reflective coating. Further, according to a preferred embodiment of the invention, the electroactive polymer actuator comprises multiple conductor lines. The conductor lines may e.g. be arranged in parallel lines for a longitudinal light source; alternatively, the multiple conductor lines may be nested into each other. Such conductor lines allow easy control of the spatial voltage distribution for providing the desired shape to the electroactive polymer actuator. With respect to this, according to a preferred embodiment of the invention, the voltage control arrangement is adapted for driving the conductor lines with different voltages.

The conductor lines can be arranged in multiple, different forms and shapes. However, according to a preferred embodiment of the invention, the conductor lines take the form of concentric circles. Preferably, these conductor lines taking the form of concentric circles each comprise an electrical feed line for providing them with the desired voltage values.

A spatially varying voltage distribution can be achieved in multiple different ways. Especially, it is possible to supply the conductor lines directly with different voltage values. However, a spatially varying voltage distribution can also be achieved with the aid of an appropriate design of the conductor lines themselves: According to a preferred embodiment of the invention, the conductor lines all have the same width, and the distance between the conductor lines increases from the inside to the outside. According to an alternative preferred embodiment of the invention, the distances between the conductor lines are all the same, and the respective widths of the conductor lines decrease from the inside to the outside. In both cases, according to a preferred embodiment of the invention, adjacent conductor lines are alternately connected to the anode or the cathode of a voltage source.

The electroactive polymer actuator can be designed in multiple different ways. However, according to a preferred embodiment of the invention, the electroactive polymer actuator comprises multiple elastic layers on top of each other, with adjacent elastic layers being separated from each other by multiple conductor lines, and a reflective elastic layer being on top of the other elastic layers. With such a stack, different shapes of the reflective surface can be achieved and, e.g., a concave mirror may be formed.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
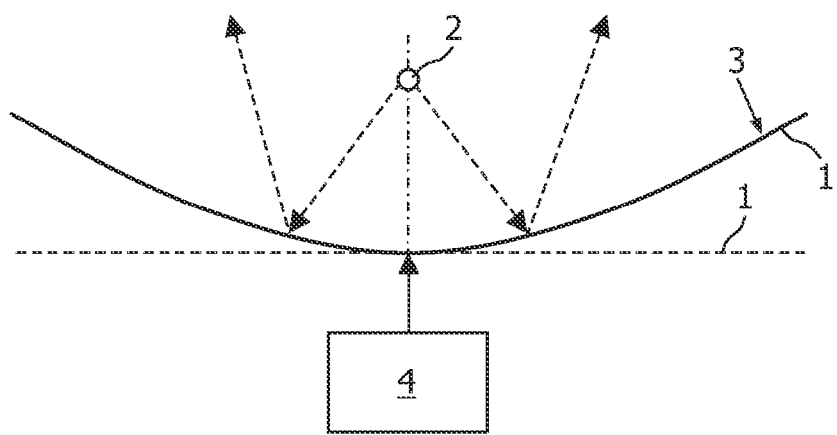
FIG. 1 shows the general operating principle of a lighting device according to a first embodiment of the invention.

From FIG. 1 the general operating principle of a lighting device according to a first preferred embodiment of the invention can be seen. The lighting device comprises a reflective electroactive polymer actuator 1 and a LED as lighting element 2 which illuminates the electroactive polymer actuator 1. The electroactive polymer actuator 1 is provided with a reflective coating 3. Accordingly, light emitted from the lighting element 2 and incident on the reflective coating 3 of the electroactive polymer actuator 1 is reflected back and, thus, forms the light beam which is emitted from the lighting device according to the first preferred embodiment of the invention.

Further, according to the first preferred embodiment of the invention, a voltage control arrangement 4 for driving the electroactive polymer actuator 1 with a spatially varying voltage distribution is provided. With the aid of this voltage control arrangement 4 the shape of the electroactive polymer actuator 1 can be varied as indicated in FIG. 1: the dashed line depicts the electroactive polymer actuator 1 in its initial state in which no spatially varying voltage distribution is generated, while the solid line depicts the deformed state in which the electroactive polymer actuator 1 assumes the shape of a parabolic arc. This makes it possible to continuously shape the light beam, which is emitted by the lighting device according to the first preferred embodiment of the invention, with the help of the voltage control arrangement 4. Accordingly, it is an essential advantage of the invention that during operation, the light beam can be shaped continuously in a versatile way with little effort.

Figure 2:
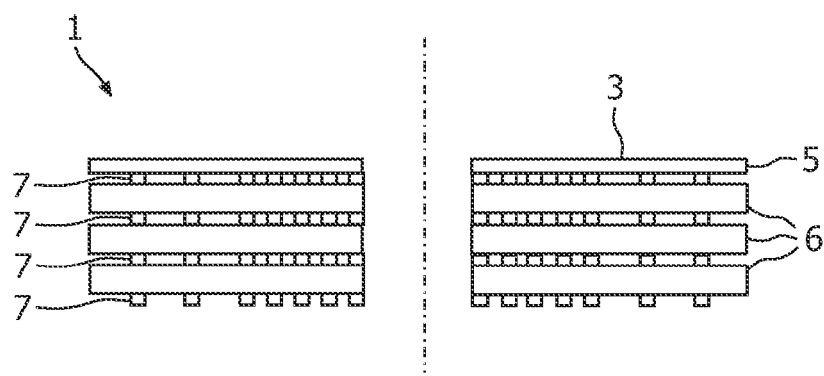
FIG. 2 schematically depicts a reflective electroactive polymer actuator according to a second embodiment of the invention in a sectional view.

In FIG. 2 a reflective electroactive polymer actuator 1 according to a second embodiment of the invention is schematically depicted in a sectional view. The electroactive polymer actuator 1 comprises a thin passive top layer 5 and multiple layers 6 underneath, all layers 6 being made of an elastic electroactive polymer material which can be actuated by an applied voltage. Further, the top layer 5 is provided with a reflective coating 3. The LED which acts as a light source and irradiates the reflective electroactive polymer actuator 1 with incident light is not shown in this and the following Figures for the sake of clarity.

Figure 3:
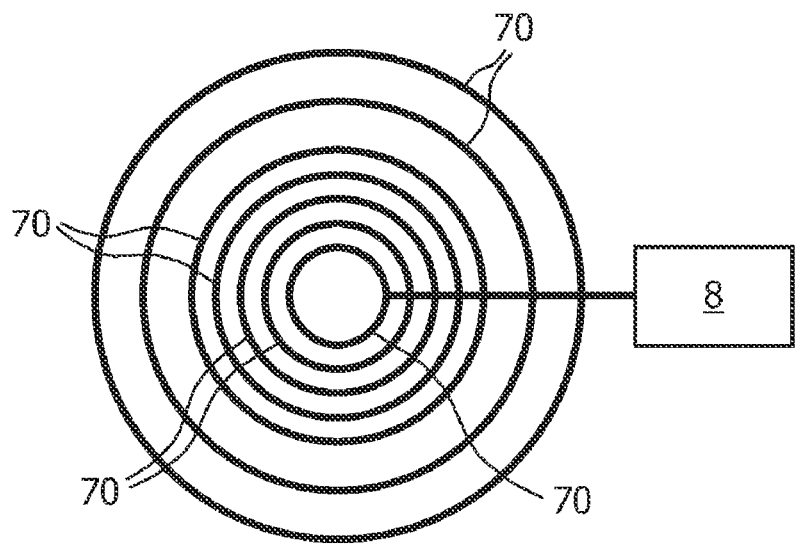
FIG. 3 schematically depicts a patterned electrode of the electroactive polymer actuator according to the second embodiment of the invention in a top view.

Between the layers 5, 6 patterned electrodes 7 are provided. Schematically, one of these electrodes 7 can be seen from FIG. 3 in a top view. Conductor lines 70 are nested into each other and are in the form of concentric circles. The conductor lines 70 are connected to each other and to a terminal 8—either cathode or anode—of the voltage control arrangement 4. Adjacent electrodes 7 are alternately connected to a cathode or an anode of the voltage control arrangement 4. As can been seen from FIG. 3, the conductor lines 70 of the electrodes 7 all have the same width, but the interspace between them increases from the inside to the outside. This way, the strain in the elastic layers 6 decreases from the inside to the outside when a voltage is applied and, thus, a parabolic form of the reflectively coated layer 5 can be achieved.

Figure 4:
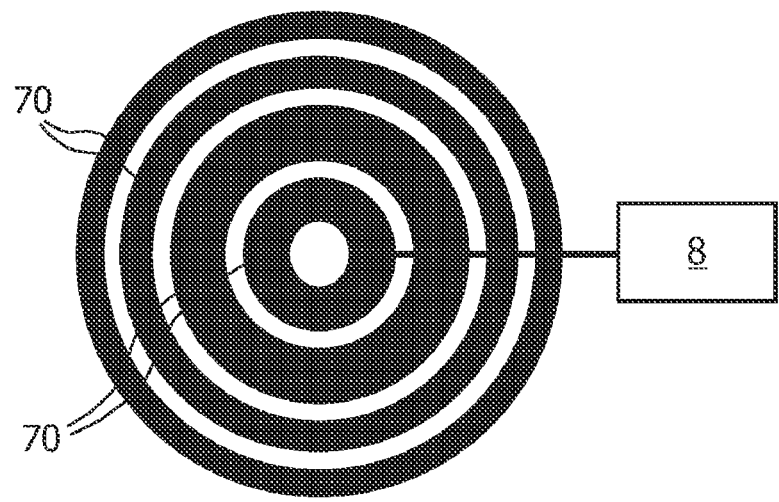
FIG. 4 schematically depicts a patterned electrode of an electroactive polymer actuator according to a third embodiment of the invention in a top view.

As can be seen from FIG. 4, which schematically depicts a patterned electrode of an electroactive polymer actuator according to a third embodiment of the invention in a top view, alternatively, the distances between the conductor lines 70 of the electrodes 7 are all the same, but the widths of the conductor lines 70 decrease from the inside to the outside. This is another way of achieving that the strain in the elastic layers 6 decreases from the inside to the outside when a voltage is applied, also providing for the possibility of a parabolic form of the reflectively coated layer 5.

Figure 5:
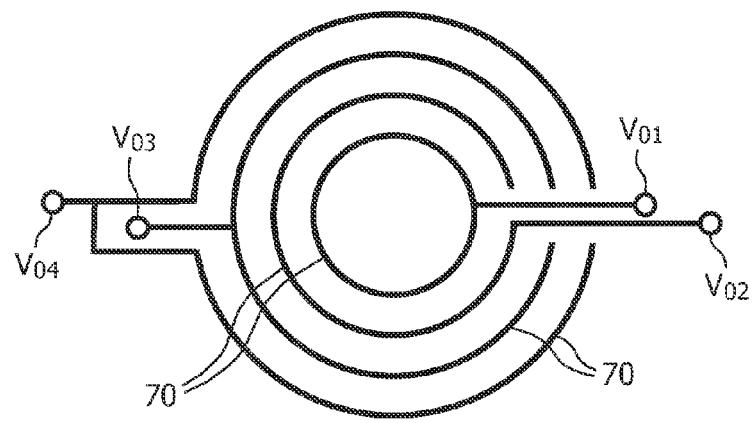
FIG. 5 schematically depicts a patterned electrode of an electroactive polymer actuator according to a fourth embodiment of the invention in a top view.

Further, FIG. 5 schematically depicts a patterned electrode of an electroactive polymer actuator according to a fourth embodiment of the invention in a top view. According to this fourth embodiment of the invention, the widths between the conductor lines 70 of the electrodes 7 and the distances between the conductor lines 70 are all the same. However, different voltages $V_{01}$ to $V_{04}$ can be applied to the different conductor lines 70 of the electrode 7. If the voltages decrease from the inside to the outside, also the strain in the elastic layers 6 decreases from the inside to the outside and the respective electroactive polymer actuator deforms.

Figure 6A:
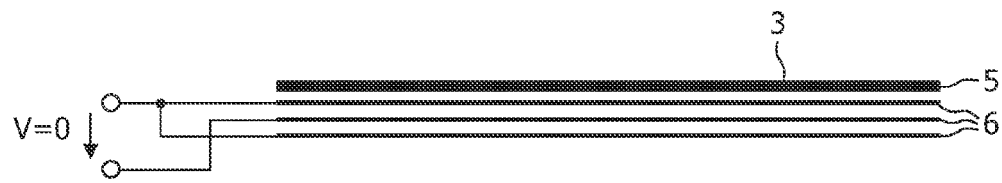
FIG. 6a, b, c schematically depict sectional views of a reflective electroactive polymer actuator according to a fifth embodiment of the invention in an initial position (V=0), altered position (V=V$_0$), and initial but pre-bent position (V=0), respectively.
Figure 6B:
Figure 6C:

FIG. 6a, b, c schematically depict in a sectional view a reflective electroactive polymer actuator according to a fifth embodiment of the invention in an initial position (V=0), altered position (V=V$_0$), and initial but pre-bent position (V=0), respectively. The top layer 5 is a passive layer with substantial bending strength and is provided with a reflective coating 3. The layers 6 underneath are active layers which can be deformed with the aid of an applied voltage. Further, the layers 6 under the top layer 5 can be comprised of one or more stacked layers of an electroactive polymer material. As can be seen from FIG. 6b, when a voltage is applied, the system deforms from a flat to a concave shape. However, the system can also be pre-bent, i.e. if no voltage is applied there is already some degree of concavity, as can be seen from FIG. 6c. For example, this can be achieved by gluing the layers 5, 6 together in this pre-bent state.

Figure 7:
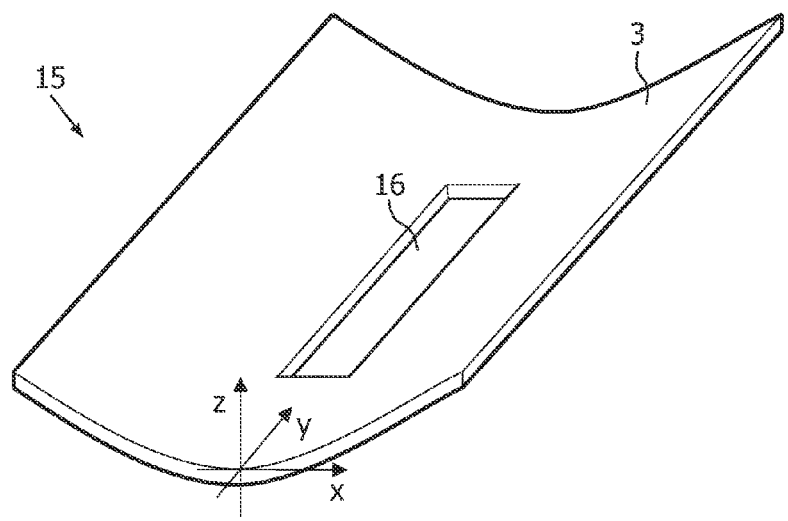
FIG. 7 schematically depicts a reflective electroactive polymer actuator according to a sixth embodiment of the invention in a 3D representation.
Figure 8:
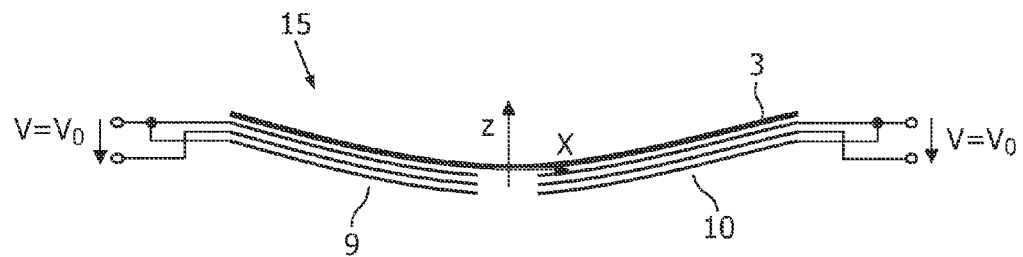
FIG. 8 schematically depicts the reflective electroactive polymer actuator according to the sixth embodiment of the invention in a sectional view with differently controlled groups of electrodes on each side.

From FIG. 7 a reflective electroactive polymer actuator according to a sixth embodiment of the invention can be seen in a 3D representation. According to this preferred embodiment of the invention, a cylindrical mirror is provided which comprises an opening for a LED (not shown) in a middle region. The cylindrical form is achieved by providing a voltage distribution which varies along the x-axis but is constant along the y-axis. Further, from FIG. 8 it can be seen that the reflective electroactive polymer actuator according to the sixth embodiment of the invention can be provided with differently controlled groups 9, 10 of electrodes on each side. Due to the different voltages $V_{01}$ and $V_{02}$, the reflective surface is deformed asymmetrically relative to the z-axis. Thus, the light beam emitted by the lighting device according to the sixth embodiment of the invention can be pivoted into different directions.

Figure 9:
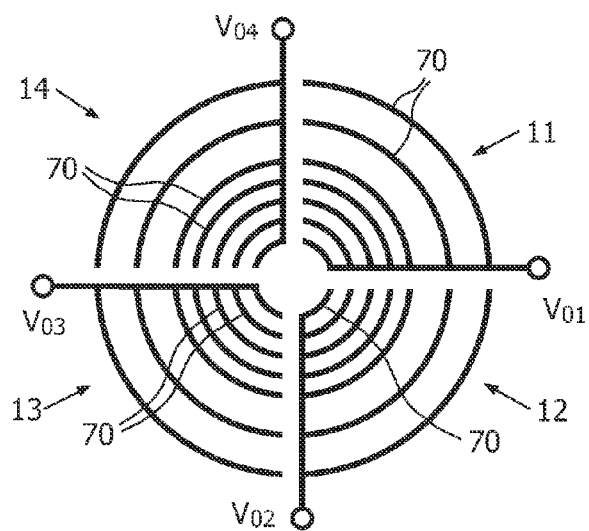
FIG. 9 schematically depicts a patterned electrode of an electroactive polymer actuator according to a seventh embodiment of the invention in a top view.

Finally, FIG. 9 schematically depicts a patterned electrode 7 of an electroactive polymer actuator according to a seventh embodiment of the invention in a top view. Here, the electrodes 7 are patterned in circumferential direction, yielding four groups 11 to 14 of conductor lines 70. These different groups 11 to 14 can be provided with different voltages $V_{01}$ to $V_{04}$, providing for the possibility of pivoting the light beam in different directions.

While the invention has been illustrated and described in detail in the drawings and the foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lighting device comprising
   at least partly reflective electroactive polymer actuator comprising a plurality of conductor lines, wherein the distance between adjacent conductor lines sequentially increases towards an outer edge of actuator,
   a lighting element illuminating the electroactive polymer actuator, and
   a voltage control arrangement for driving the electroactive polymer actuator with a spatially varying voltage distribution.

2. The lighting device according to claim 1, wherein the lighting element comprises an LED.

3. The lighting device according to claim 1, wherein the lighting element is at least partly located in a focal point of the electroactive polymer reflector.

4. The lighting device according to claim 1, wherein the voltage control arrangement is adapted for driving the conductor lines with different voltages.

5. The lighting device according to claim 1, wherein the conductor lines are arranged in concentric circles.

6. The lighting device according to claim 5, wherein the conductor lines all have the same width.

7. The lighting device according to claim 5, wherein adjacent conductor lines are alternately connected to the anode or the cathode of a voltage source.

8. The lighting device according to claim 1, wherein the electroactive polymer actuator comprises multiple elastic layers on top of each other, wherein adjacent elastic layers are separated from each other by multiple conductor lines.

9. A lighting device, comprising
   at least partly reflective electroactive polymer actuator
   a lighting element illuminating the electroactive polymer actuator, and
   a voltage control arrangement for driving the electroactive polymer actuator with a spatially varying voltage distribution, wherein the electroactive polymer actuator comprises a plurality of conductor lines, and wherein the distances between the conductor lines are all the same, and the respective widths of the conductor lines sequentially decrease towards an outer edge of the actuator.

10. A lighting device, comprising
    at least partly reflective electroactive polymer actuator
    a lighting element illuminating the electroactive polymer actuator, and
    a voltage control arrangement for driving the electroactive polymer actuator with a spatially varying voltage distribution, wherein the electroactive polymer actuator comprises a plurality of conductor lines and a plurality of elastic layers on top of each other, wherein adjacent elastic layers are separated from each other by multiple conductor lines.

* * * * *